(12) United States Patent
Okimura et al.

(10) Patent No.: US 10,471,682 B2
(45) Date of Patent: Nov. 12, 2019

(54) ADHESIVE COMPOSITION AND LAMINATE WITH ADHESIVE LAYER USING SAME

(71) Applicant: TOAGOSEI CO., LTD., Tokyo (JP)

(72) Inventors: Yuya Okimura, Nagoya (JP); Masashi Yamada, Nagoya (JP)

(73) Assignee: TOAGOSEI CO., LTD., Tokyo (JP)

( * ) Notice: Subject to any disclaimer, the term of this patent is extended or adjusted under 35 U.S.C. 154(b) by 48 days.

(21) Appl. No.: 15/513,905

(22) PCT Filed: Aug. 7, 2015

(86) PCT No.: PCT/JP2015/072455
§ 371 (c)(1),
(2) Date: Mar. 23, 2017

(87) PCT Pub. No.: WO2016/047289
PCT Pub. Date: Mar. 31, 2016

(65) Prior Publication Data
US 2017/0297302 A1    Oct. 19, 2017

(30) Foreign Application Priority Data

Sep. 24, 2014    (JP) ................. 2014-193526

(51) Int. Cl.
| | |
|---|---|
| *B32B 7/12* | (2006.01) |
| *B32B 27/00* | (2006.01) |
| *C09J 123/26* | (2006.01) |
| *C09J 151/06* | (2006.01) |
| *B32B 15/20* | (2006.01) |

(Continued)

(52) U.S. Cl.
CPC ................. *B32B 7/12* (2013.01); *B32B 7/04* (2013.01); *B32B 7/06* (2013.01); *B32B 15/08* (2013.01); *B32B 15/088* (2013.01); *B32B 15/09* (2013.01); *B32B 15/12* (2013.01); *B32B 15/20* (2013.01); *B32B 27/00* (2013.01); *B32B 27/06* (2013.01); *B32B 27/08* (2013.01); *B32B 27/10* (2013.01); *B32B 27/28* (2013.01); *B32B 27/281* (2013.01); *B32B 27/285* (2013.01); *B32B 27/286* (2013.01); *B32B 27/288* (2013.01); *B32B 27/32* (2013.01); *B32B 27/34* (2013.01); *B32B 27/36* (2013.01); *B32B 27/38* (2013.01); *B32B 29/005* (2013.01); *C08F 255/04* (2013.01); *C09J 7/30* (2018.01); *C09J 123/26* (2013.01); *C09J 151/06* (2013.01); *H01B 3/40* (2013.01); *H01B 3/441* (2013.01); *H01B 7/04* (2013.01); *H01B 7/08* (2013.01); *H05K 1/036* (2013.01); *H05K 1/0393* (2013.01); *B32B 2250/02* (2013.01); *B32B 2250/03* (2013.01); *B32B 2255/10* (2013.01); *B32B 2255/12* (2013.01); *B32B 2255/26* (2013.01); *B32B 2307/204* (2013.01); *B32B 2307/3065* (2013.01); *B32B 2307/546* (2013.01); *B32B 2307/732* (2013.01); *B32B 2307/748* (2013.01); *B32B 2309/105* (2013.01); *B32B 2405/00* (2013.01); *B32B 2457/08* (2013.01); *C09J 2203/302* (2013.01); *C09J 2205/114* (2013.01); *C09J 2400/163* (2013.01); *C09J 2423/10* (2013.01); *C09J 2423/16* (2013.01); *C09J 2451/00* (2013.01); *C09J 2463/00* (2013.01); *C09J 2467/005* (2013.01); *C09J 2479/086* (2013.01);

(Continued)

(58) Field of Classification Search
CPC .......... C09J 151/06; H01B 3/441; H01B 3/40; B32B 27/38; B32B 27/32
See application file for complete search history.

(56) References Cited

U.S. PATENT DOCUMENTS

| | | | |
|---|---|---|---|
| 2006/0014871 A1* | 1/2006 | Toriumi | ................. C09J 163/00 524/270 |
| 2016/0036013 A1 | 2/2016 | Nakazato et al. | |
| 2017/0096586 A1* | 4/2017 | Sakata | ................. B32B 15/08 |

FOREIGN PATENT DOCUMENTS

| | | |
|---|---|---|
| JP | H07-235767 A | 9/1995 |
| JP | H08-193148 A | 7/1996 |

(Continued)

OTHER PUBLICATIONS

PRC (SIPO) Office Action, dated May 18, 2018, issued in Chinese Appln. CN201580051028.0.

(Continued)

*Primary Examiner* — Jeffrey C Mullis
(74) *Attorney, Agent, or Firm* — Fitch, Even, Tabin & Flannery LLP

(57) ABSTRACT

An adhesive composition, which exhibits excellent adhesion to base films made from polyimide resins and the like or copper foils, as well as superior electrical properties, and a laminate having an adhesive layer, which is low in warpage when the adhesive layer is in the B stage, and which is excellent in storage stability of the laminate, are provided. The adhesive composition includes a modified polyolefin-based resin and an epoxy resin, in which the modified polyolefin-based resin is a resin resulting from graft-modification of an unmodified olefin resin with a modifying agent containing an $\alpha,\beta$-unsaturated carboxylic acid or derivative thereof, wherein the content of the modified polyolefin-based resin is 50 parts by mass or more relative to 100 parts by mass of the solid content of the adhesive composition; the content of the epoxy resin is from 1 to 20 parts by mass relative to 100 parts by mass of the modified polyolefin-based resin; and the dielectric constant of a cured body of the adhesive is less than 2.5 as measured at a frequency of 1 GHz.

21 Claims, No Drawings

(51) Int. Cl.

| | | |
|---|---|---|
| *B32B 27/06* | (2006.01) | |
| *B32B 27/32* | (2006.01) | |
| *B32B 27/38* | (2006.01) | |
| *H01B 3/40* | (2006.01) | |
| *H01B 3/44* | (2006.01) | |
| *H01B 7/04* | (2006.01) | |
| *H01B 7/08* | (2006.01) | |
| *H05K 1/03* | (2006.01) | |
| *C09J 7/30* | (2018.01) | |
| *C08F 255/04* | (2006.01) | |
| *B32B 7/04* | (2019.01) | |
| *B32B 7/06* | (2019.01) | |
| *B32B 15/08* | (2006.01) | |
| *B32B 15/088* | (2006.01) | |
| *B32B 15/09* | (2006.01) | |
| *B32B 15/12* | (2006.01) | |
| *B32B 27/08* | (2006.01) | |
| *B32B 27/10* | (2006.01) | |
| *B32B 27/28* | (2006.01) | |
| *B32B 27/34* | (2006.01) | |
| *B32B 27/36* | (2006.01) | |
| *B32B 29/00* | (2006.01) | |
| *H01B 1/02* | (2006.01) | |
| *H05K 1/09* | (2006.01) | |
| *H05K 3/38* | (2006.01) | |

(52) U.S. Cl.
CPC ............... *H01B 1/02* (2013.01); *H05K 1/09* (2013.01); *H05K 3/386* (2013.01)

(56) References Cited

FOREIGN PATENT DOCUMENTS

| | | |
|---|---|---|
| JP | H10-17685 A | 1/1998 |
| JP | 2001-354936 A | 12/2001 |
| JP | 2002-88332 A | 3/2002 |
| JP | 2004-75853 A | 3/2004 |
| JP | 2007-2121 A | 1/2007 |
| JP | 2013-91702 A | 5/2013 |
| JP | 2014-218633 A | 11/2014 |
| JP | 5700166 B1 | 4/2015 |
| TW | 201614027 | 4/2016 |
| WO | 2016/031342 A1 | 3/2016 |

OTHER PUBLICATIONS

International Search Report for PCT/JP2015/072455 dated Nov. 2, 2015; English translation submitted herewith (4 pages).
Written Opinion of the International Searching Authority dated Nov. 2, 2015 (translation) from PCT/JP2015/072455 filed Aug. 7, 2015.
Office Action (JPO), apparently issued against JP Appln. 2016-550022 on or about Nov. 1, 2018, with the translation being dated on or about Dec. 27, 2018.
Third Office Action (PRC), apparently issued against PRC Appln. 201580051028.0 on or about May 23, 2019, together with translation from the Global Dossier.
JPO Office Action dated May 10, 2018 issued re JP Appln. JP2016-559922.
JPO Office Action dated Nov. 1, 2018 issued re JP Appln. JP2016-559922.
JPO Office Action dated Jun. 23, 3-29 issued re JP Appln. JP2016-559922.

* cited by examiner

ADHESIVE COMPOSITION AND LAMINATE WITH ADHESIVE LAYER USING SAME

CROSS-REFERENCE TO RELATED APPLICATIONS

This application is a U.S. national phase application filed under 35 U.S.C. § 371 of International Application No. PCT/JP2015/072455, filed Aug. 7, 2015, designating the United States, which claims priority from Japanese Patent Application No. 2014-193526, filed Sep. 24, 2014, and the complete disclosures of which applications are hereby incorporated herein by reference in their entirety for all purposes.

TECHNICAL FIELD

The present invention relates to an adhesive composition and a laminate having an adhesive layer using the same. In further detail, it relates to an adhesive composition and a laminate having an adhesive layer suitable for use in bonding electronic parts and the like, particularly for manufacturing products related to flexible printed circuits (hereinafter often referred to as "FPC").

BACKGROUND ART

Since the flexible printed circuit can be mounted three-dimensionally with high density even within a limited space, their application is expanding. Recently, as electronic devices become more compact and lightweight, the products related to flexible printed circuits are diversifying and the demand for them is increasing. As such products related to FPC, there can be mentioned a flexible copper clad laminate in which a copper foil is bonded to a polyimide film; a flexible printed circuit in which an electronic circuit is formed on the flexible copper clad laminate; a reinforced flexible printed circuit in which the flexible printed circuit is bonded to a reinforcing board; a multilayered board having flexible copper clad laminates or flexible printed circuits layered and bonded with each other; a flexible flat cable (hereinafter often referred to as "FFC") comprising copper wiring bonded to a base film, and the like. For example, when the flexible copper clad laminate is manufactured, an adhesive is usually used for bonding the polyimide film and the copper foil together.

Further, when the flexible printed circuit is manufactured, a film so-called "coverlay film" is generally used for protecting wired portions. The coverlay film consists of an insulating resin layer and an adhesive layer formed thereon, and a polyimide resin composition is widely used for forming the insulating resin layer. In manufacturing the flexible printed circuits, the coverlay film is bonded to the surface having wiring portions thereon via the adhesive layer by means of, for instance, a heat press. In this instance, the adhesive layer of the coverlay film is required to establish a strong adhesion to both the wiring portions and the base film layer.

In addition, as a printed circuit, a build-up multilayer printed circuit in which a conductor layer and an organic insulator layer are alternately layered on a surface of a substrate is known. When such a multilayer printed circuit is manufactured, a material forming an insulating adhesive layer, so-called a "bonding sheet", is used for bonding the conductor layer and the organic insulator layer. The insulating adhesive layer is required to have embeddability to the wiring portions and establish a strong adhesion to both materials of the conductor portions forming the circuit (copper and the like) and the organic insulator layer (polyimide resins and the like).

As adhesives for use in the FPC related products, there have been proposed epoxy-based adhesive compositions containing a thermoplastic resin highly reactive with the epoxy resin. For instance, Patent Document 1 discloses an adhesive that is based on an ethylene-acrylate copolymer rubber and an epoxy resin. Furthermore, Patent Document 2 discloses an adhesive that is based on a glycidyl group-containing thermoplastic elastomer and an epoxy resin. Moreover, Patent Document 3 discloses an adhesive that is based on a styrene-maleic acid copolymer and an epoxy resin. Adhesive compositions described in theses references are widely used because they perform fast curing reaction and have excellent adhesiveness by virtue of reactivity of carboxylic groups of the rubber or elastomer components with the epoxy resin.

Furthermore, in the field of mobile communication equipment such as mobile phones and information terminal devices which are now rapidly increasing in demand, higher frequency signals are used to process a huge amount of data at high speed. Accordingly, with the increase in signal speed and signal frequency, the adhesive for use in FPC-related products must satisfy electrical properties in the high frequency region (i.e, low dielectric constant and low dielectric loss tangent). To cope with such demands for electrical properties, for example, Patent Document 4 discloses an epoxy resin composition containing an epoxy resin, a copolymer resin made from, as essential components, an aromatic vinyl compound and maleic anhydride, and a specific phenol compound.

CONVENTIONAL TECHNICAL DOCUMENTS

Patent Documents

Patent Document 1: Japanese Patent Publication (Laid-open) No. H7(1995)-235767.
Patent Document 2: Japanese Patent Publication (Laid-open) No. 2001-354936.
Patent Document 3: Japanese Patent Publication (Laid-open) No. 2007-2121.
Patent Document 4: Japanese Patent Publication (Laid-open) No. H10(1998)-17685.

SUMMARY OF INVENTION

Problems to be Solved by the Invention

However, with the increase in signal frequency as described above, the adhesive compositions disclosed in Patent Documents 1-4 are problematic in that their electrical properties in the ultra high frequency microwave region (1 to 3 GHz) are poor. In addition, laminates with adhesive layers of these adhesive compositions sometimes warp before thermosetting (in B stage), and therefore they suffer from the problem of bad workability during the FPC production process. A thinner base film is required to improve the electrical properties, however, even when the base film is made thinner, it is still desired that the warpage of the laminate having the adhesive layer is suppressed. Furthermore, the laminate having an adhesive layer of these adhesive compositions is problematic in that it is inferior in storage stability in the laminate state.

The present invention has been made in light of the above described problems, and aims at providing an adhesive composition which is excellent in adhesion to base films made from polyimide resins and the like or copper foils, and exhibiting superior electrical properties. Another objective is to provide a laminate having an adhesive layer, which is low in warpage when the adhesive layer is in B stage, and which is excellent in storage stability of the laminate.

Means for Solving the Problems

The present inventors have found that an adhesive composition containing a modified polyolefin-based resin and an epoxy resin in which the contents of the modified polyolefin-based resin and the epoxy resin are within specific amounts exhibits excellent adhesiveness and electrical properties. In addition, a laminate with an adhesive obtained from this adhesive composition in which the layer of the adhesive is in B-stage exhibits not only excellent adhesiveness but also little warpage and excellent storage stability. The present invention has been accomplished based on these findings.

Thus, an adhesive composition according to the present invention and a laminate having an adhesive layer using the same are described as follows.

1. An adhesive composition comprising a modified polyolefin-based resin (A) and an epoxy resin (B), the modified polyolefin-based resin (A) being a resin resulting from graft-modification of an unmodified polyolefin resin with a modifying agent comprising an $\alpha,\beta$-unsaturated carboxylic acid or derivative thereof, wherein the content of the modified polyolefin-based resin (A) is 50 parts by mass or more relative to 100 parts by mass of the solid content of the adhesive composition, and the content of the epoxy resin (B) is 1 to 20 parts by mass relative to 100 parts by mass of the modified polyolefin-based resin (A), the adhesive composition exhibiting a dielectric constant lower than 2.5 as measured at a frequency of 1 GHz when made into a cured body.

2. The adhesive composition according to the above item 1, wherein the unmodified polyolefin resin is at least one selected from the group consisting of ethylene-propylene copolymers, propylene-butene copolymers and ethylene-propylene-butene copolymers.

3. The adhesive composition according to the above item 1 or 2, wherein the derivative of the $\alpha,\beta$-unsaturated carboxylic acid is at least one selected from the group consisting of itaconic anhydride, maleic anhydride, aconitic anhydride and citraconic anhydride.

4. The adhesive composition according to any one of the above items 1 to 3, wherein the content percentage of the grafted portions derived from the $\alpha,\beta$-unsaturated carboxylic acid or derivative thereof is 0.1 to 20 mass % relative to 100 mass % of the modified polyolefin-based resin.

5. The adhesive composition according to any one of the above items 1 to 4, wherein the weight average molecular weight of the modified polyolefin-based resin (A) is from 30,000 to 250,000.

6. The adhesive composition according to any one of the above items 1 to 5, wherein the acid value of the modified polyolefin-based resin (A) is from 0.1 to 50 mg KOH/g.

7. The adhesive composition according to any one of the above items 1 to 6, wherein the epoxy resin (B) is an epoxy resin having no glycidylamino group.

8. The adhesive composition according to any one of the above items 1 to 7, wherein the epoxy resin (B) is a multi-functional epoxy resin having an alicyclic structure.

9. A laminate having an adhesive layer, which comprises an adhesive layer formed of an adhesive composition according to any one of the above items 1 to 8 and a base film contacting at least one of the surfaces of the adhesive layer, wherein the adhesive layer is in B-stage.

10. The laminate having an adhesive layer, according to the above item 9, wherein the adhesive layer is formed by coating a resin varnish comprising the aforementioned adhesive composition and a solvent on a surface of the base film to form a resin varnish layer, and then removing the solvent from the resin varnish layer.

11. The laminate having an adhesive layer, according to the above item 9 or 10, which has a ratio (H/L) of less than 0.05 wherein H is an elevation of an edge of the laminate and L is a side length of the laminate when the laminate having an adhesive layer is square-shaped and placed on a horizontal surface with the adhesive layer facing up.

12. The laminate having an adhesive layer, according to any one of the above items 9 to 11, wherein the base film is at least one selected from the group consisting of a polyimide film, a polyether ether ketone film, a polyphenylene sulfide film, an aramid film, a polyethylene naphthalate film, a liquid crystal polymer film, a polyethylene terephthalate film, a polyethylene film, a polypropylene film, a silicone-treated release paper, a polyolefin resin-coated paper, a polymethylpentene film, and a fluororesin film.

13. The laminate having an adhesive layer, according to any one of the above items 9 to 12, wherein the thickness of the base film is from 5 to 100 µm.

14. The laminate having an adhesive layer, according to any one of the above items 9 to 13, wherein the thickness of the adhesive layer is from 5 to 100 µm.

15. The laminate having an adhesive layer, according to any one of the above items 9 to 14, wherein the thickness of the adhesive layer is equal to or thicker than the thickness of the base film.

16. The laminate having an adhesive layer, according to any one of the above items 9 to 15, which exhibits a dielectric constant lower than 3.0 and a dielectric loss tangent lower than 0.01, as measured at a frequency of 1 GHz after curing the adhesive layer.

17. A flexible copper clad laminate which comprises a laminate having an adhesive layer according to any one of the above items 9 to 16 and a copper foil bonded onto the adhesive layer of the laminate.

18. A flexible flat cable which comprises a laminate having an adhesive layer according to any one of the above items 9 to 16 and a copper foil bonded onto the adhesive layer of the laminate.

In the present specification, the weight average molecular weight (hereinafter often referred to as "Mw") is a standard polystyrene equivalent measured by gel permeation chromatography (hereinafter often referred to as "GPC"). In addition, a description "(meth)acryl" means acryl and methacryl.

Effect of the Invention

The adhesive composition according to the present invention is excellent in adhesion to base films made from polyimide resins and the like or copper foils, resin flow, and electrical properties (such as low dielectric constant and low dielectric loss tangent). The laminate having the adhesive layer using the present adhesive composition shows little warpage, and thus exhibits excellent workability in the manufacturing processes of various types of components, and favorable storage stability of the laminates. Accordingly, the adhesive composition of the present invention and the laminate having the adhesive layer using the same are suitable for manufacture and the like of the FPC-related products.

DESCRIPTION OF EMBODIMENTS

Embodiments of the present invention will be explained below; however, the present invention is not limited thereto.
1. Adhesive Composition The adhesive composition according to the present invention comprises a modified polyolefin-based resin (A) and an epoxy resin (B), which is characterized in that the modified polyolefin-based resin (A) is a resin resulting from graft-modification of an unmodified polyolefin resin with a modifying agent comprising an α,β-unsaturated carboxylic acid or derivative thereof, wherein the content of the modified polyolefin-based resin (A) is 50 parts by mass or more relative to 100 parts by mass of the solid content of the adhesive composition, and the content of the epoxy resin (B) is 1 to 20 parts by mass relative to 100 parts by mass of the modified polyolefin-based resin (A), and moreover, the adhesive composition exhibits a dielectric constant lower than 2.5 as measured at a frequency of 1 GHz when made into a cured body. Specific matters that define the present invention are described in detail below.

The modified polyolefin-based resin (A) is a resin having a portion derived from an unmodified polyolefin resin and a grafted portion derived from a modifying agent, and is preferably a resin obtained by graft-polymerizing a modifying agent containing an α,β-unsaturated carboxylic acid or derivative thereof in a presence of an unmodified polyolefin resin. The manufacture of the modified polyolefin-based resin by graft-polymerization can be carried out in a known method, and a radical initiator may be used at the time of manufacturing. Examples of the manufacturing method of the modified polyolefin-based resin include a solution method in which the unmodified polyolefin resin is heated and dissolved in a solvent such as toluene followed by addition of the modifying agent and the radical initiator, and a melting method in which the unmodified polyolefin resin, the modifying agent and the radical initiator are molten and kneaded using a Banbury mixer, a kneader, an extruder or the like. How to use the unmodified polyolefin resin, the modifying agent and the radical initiator is not particularly limited, and these may be added collectively or successively into the reaction system.

When the modified polyolefin-based resin is manufactured, a modifying aid for improving graft efficiency of an α,β-unsaturated carboxylic acid, a stabilizer for adjusting resin stability and the like can further be used.

The unmodified polyolefin resin is not particularly limited as long as it has structure units derived from olefins, and a homopolymer or copolymer of olefins with 2 to 20 carbon atoms such as ethylene, propylene, butene, pentene, hexene, heptene, octene, 4-methyl-1-pentene is preferably used. In the present invention, a homopolymer or copolymer of an olefin with 2 to 6 carbon atoms is particularly preferable. The content percentage of the structure units in the unmodified polyolefin resin can optionally be selected, however, when adhesion to an adherend that is hard to bond is required, the modified polyolefin-based resin is preferably a modified resin of an ethylene-propylene, propylene-butene or ethylene-propylene-butene copolymer. Further, in case particularly excellent adhesiveness is required, an unmodified polyolefin resin with the content percentage of propylene units being 50 mol % to 98 mol % is preferably used.

When the content percentage of propylene units is within the above range, flexibility can be imparted to bonded portions between the two members that have been bonded together. Moreover, the molecular weight of the unmodified polyolefin resin is not particularly limited.

The modifying agent includes an α,β-unsaturated carboxylic acid and derivative thereof. Examples of the α,β-unsaturated carboxylic acid include maleic acid, fumaric acid, tetrahydrophthalic acid, itaconic acid, citraconic acid, crotonic acid, aconitic acid, norbornene dicarboxylic acid and the like. In addition, examples of the derivative of the unsaturated polycarboxylic acid include acid anhydrides, acid halides, amides, imides, esters and the like. As the modifying agent, itaconic anhydride, maleic anhydride, aconitic anhydride and citraconic anhydride are preferable, and itaconic anhydride and maleic anhydride are particularly preferable from the viewpoint of adhesiveness. When a modifying agent is used, it may be one selected from the α,β-unsaturated carboxylic acids and derivatives thereof, and can be a combination of one or more of the α,β-unsaturated carboxylic acids and one or more of derivatives thereof, a combination of two or more of the α,β-unsaturated carboxylic acids, or a combination of two or more of the derivatives of the α,β-unsaturated carboxylic acids.

The modifying agent according to the present invention can comprise another compound (another modifying agent) in addition to the α,β-unsaturated carboxylic acid and the like in accordance with purposes. Examples of such another compound (another modifying agent) include (meth)acrylates represented by the following formula, (meth)acrylic acids, other (meth)acrylic acid derivatives, aromatic vinyl compounds, cyclohexyl vinyl ether and the like. Such another compound can be used alone or in combination of two or more.

$$CH_2=CR^1COOR^2 \qquad (1)$$

(wherein $R^1$ is a hydrogen atom or a methyl group, and $R^2$ is a hydrocarbon group.)

In the above formula (1) representing (meth)acrylates, $R^1$ is a hydrogen atom or a methyl group, and preferably a methyl group. $R^2$ is a hydrocarbon group and preferably an alkyl group with 8 to 18 carbon atoms. Examples of the compounds represented by the above formula (1) include methyl (meth)acrylate, ethyl (meth)acrylate, propyl (meth)acrylate, butyl (meth)acrylate, pentyl (meth)acrylate, hexyl (meth)acrylate, heptyl (meth)acrylate, octyl (meth)acrylate, decyl (meth)acrylate, lauryl (meth)acrylate, tridecyl (meth)acrylate, stearyl (meth)acrylate, cyclohexyl (meth)acrylate, benzyl (meth)acrylate and the like. These compounds can be used alone or in combination of two or more. Since heat resistive adhesiveness is improved, a modifying agent further comprising a (meth)acrylate with an alkyl group having 8-18 carbon atoms is preferably used, and particularly preferably one comprising octyl (meth)acrylate, lauryl (meth)acrylate, tridecyl (meth)acrylate or stearyl (meth)acrylate is used, in the present invention.

Examples of the derivatives of (meth)acrylic acid other than the (meth)acrylate include hydroxyethyl (meth)acrylate, glycidyl (meth)acrylate, isocyanate-containing (meth)acrylic acids and the like. Examples of the aromatic vinyl compounds include styrene, o-methyl styrene, p-methyl styrene, α-methyl styrene and the like. By using, as a modifying agent, the α,β-unsaturated carboxylic acid or derivative thereof in combination with another modifying agent, graft ratio can be improved, solvent solubility can be improved, or adhesiveness can further be improved. When another modifying agent than the (meth)acrylates represented by the above formula (1) is used, it is desirable that the amount of use thereof does not exceed the total of the amount of use of the α,β-unsaturated carboxylic acid and derivatives thereof and the amount of use of the (meth) acrylates.

As mentioned above, the modified polyolefin-based resin has a grafted portion derived at least from the modifying agent. Hereinafter the content percentage (hereinafter often referred to as "graft mass") of the grafted portions contained in the modified polyolefin-based resin is described.

The modified polyolefin-based resin has a grafted portion derived from the α,β-unsaturated carboxylic acid or derivative thereof. In the modified polyolefin-based resin, the graft mass of the grafted portion derived from the α,β-unsaturated carboxylic acid or derivative thereof is preferably 0.1 to 20 mass %, and more preferably 0.2 to 18 mass % relative to 100 mass % of the modified polyolefin-based resin from the viewpoint of adhesiveness. When the graft mass is 0.1 mass % or more, solvent solubility is excellent, and adhesion to adherends made from a metal or the like is particularly excellent. Also, when the graft mass is 20 mass % or less, sufficient adhesion to adherends made from resins or the like can be obtained.

The graft mass derived from the α,β-unsaturated carboxylic acid or derivative thereof in the modified polyolefin-based resin can be determined by alkalimetric titration, however, when the derivative of the α,β-unsaturated carboxylic acid is imide or others having no acid group, the graft mass can be determined by Fourier-transform infrared spectroscopy.

When the modified polyolefin-based resin comprises a grafted portion derived from (meth)acrylates represented by the above formula (1), the graft mass thereof is preferably 0.1 to 30 mass % and more preferably 0.3 to 25 mass % relative to 100 mass % of the modified polyolefin-based resin. When the graft mass is 0.1 to 30 mass %, solvent solubility is excellent, and if another resin or elastomer as described later is contained, compatibility therewith is excellent, so that adhesion to adherends can further be improved.

When the modifying agent comprises a (meth)acrylate represented by the above formula (1), the graft mass in the obtained modified polyolefin-based resin can be determined by Fourier-transform infrared spectroscopy.

The radical initiator used for manufacture of the modified polyolefin-based resin can arbitrarily be selected from the conventional ones, and those preferably used are, for example, organic peroxides such as benzoyl peroxide, dicumyl peroxide, lauroyl peroxide, di-t-butyl peroxide, 2,5-dimethyl-2,5-di(t-butylperoxy)hexane, and cumene hydroperoxide.

Examples of the modifying aid which can be used for manufacture of the modified polyolefin-based resin include divinyl benzene, hexadiene, and dicyclopentadiene. Examples of the stabilizer include hydroquinone, benzoquinone, and nitrosophenylhydroxy compounds.

The weight average molecular weight (Mw) of the modified polyolefin-based resin (A) is preferably 30,000 to 250,000, and more preferably 50,000 to 200,000. When the weight average molecular weight (Mw) is from 30,000 to 250,000, the adhesive composition can be made excellent in not only solvent solubility and initial adhesion to adherends but also solvent resistance of bonded portions after cured.

The acid value of the modified polyolefin-based resin (A) is preferably from 0.1 to 50 mg KOH/g, more preferably from 0.5 to 40 mg KOH/g, and furthermore preferably from 1.0 to 30 mg KOH/g. When the acid value is from 0.1 to 50 mg KOH/g, the adhesive composition can be cured sufficiently to achieve excellent adhesiveness, heat resistance, and resin flow.

The content of the modified polyolefin-based resin (A) should be 50 parts by mass or more, and preferably 60 parts by mass or more, relative to 100 parts by mass of the solid content of the adhesive composition. When the content is less than 50 parts by mass, the adhesive layer lacks flexibility and causes warping of the laminate.

The content of the modified polyolefin-based resin (A) is preferably 99 parts by mass or less relative to 100 parts by mass of the solid content of the adhesive composition.

Hereinafter, explanation of another component in the above adhesive composition, i.e., epoxy resin (B), is given. The epoxy resin (B) reacts with the carboxyl group of the above modified polyolefin-based resin (A) to realize high adhesion to adherends and heat resistance of cured products of the adhesive.

Examples of the epoxy resin (B) include, but are not limited to, a bisphenol A type epoxy resin, a bisphenol F type epoxy resin, or a hydrogenated product thereof; glycidyl ester type epoxy resins such as diglycidyl orthophthalate, diglycidyl isophthalate, diglycidyl terephthalate, glycidyl p-hydroxybenzoate, diglycidyl tetrahydrophthalate, diglycidyl succinate, diglycidyl adipate, diglycidyl sebacate, and triglycidyl trimellitate; glycidyl ether type epoxy resins such as ethylene glycol diglycidyl ether, propylene glycol diglycidyl ether, 1,4-butanediol diglycidyl ether, 1,6-hexanediol diglycidyl ether, trimethylolpropane triglycidyl ether, pentaerythritol tetraglycidyl ether, tetraphenylglycidylether ethane, triphenylglycidylether ethane, polyglycidyl ethers of sorbitol, and polyglycidyl ethers of polyglycerol; glycidylamine type epoxy resins such as triglycidyl isocyanurate and tetraglycidyl diaminodiphenylmethane; and linear aliphatic epoxy resins such as epoxidized polybutadiene and epoxidized soybean-oil. Also usable are novolac type epoxy resins such as phenol novolac epoxy resin, o-cresol novolac epoxy resin and bisphenol A novolac epoxy resin.

Furthermore, examples of the epoxy resins include a brominated bisphenol A type epoxy resin, a phosphorus-containing epoxy resin, an epoxy resin having dicyclopentadiene structure, an epoxy resin having naphthalene structure, an anthracene type epoxy resin, a tertiary butylcatechol type epoxy resin, a triphenylmethane type epoxy resin, a tetraphenylethane type epoxy resin, a biphenyl type epoxy resin, and a bisphenol S type epoxy resin. These epoxy resins may be used alone or in combination of two or more.

Among the above epoxy resins, preferred are those having no glycidylamino group because the storage stability of the laminate having an adhesive layer can be improved. Furthermore, because an adhesive composition having excellent electrical properties can be obtained, preferred are epoxy resins having an aliphatic cyclic structure, and more preferred are epoxy resins having a dicyclopentadiene structure.

The epoxy resin for use in the present invention is preferably one having two or more epoxy groups per one molecule, because it reacts with the modified polyolefin-based resin to form a crosslinking structure and realize high thermal resistance. When an epoxy resin having two or more epoxy groups is used, sufficient crosslinking with the modified polyolefin-based resin is formed to establish sufficient thermal resistance.

The content of the epoxy resin (B) should be from 1 to 20 parts by mass relative to 100 parts by mass of the above modified polyolefin-based resin (A). Preferably, the content is from 3 to 15 parts by mass. If the content is less than 1 parts by mass, sufficient adhesiveness or thermal resistance may not be obtained. On the other hand, if the content exceeds 20 parts by mass, peel adhesion strength or electrical properties may be impaired.

The adhesive composition according to the present invention is characterized in that it comprises the predetermined amounts of the modified polyolefin-based resin (A) and the epoxy resin (B), and exhibits a dielectric constant (ε) lower than 2.5 as measured at a frequency of 1 GHz after the adhesive has been made into a cured body. When the dielectric constant is lower than 2.5, the composition is suitable for application to the FPC-related products. In addition, it is preferable that the cured body of the adhesive has a dielectric loss tangent (tan δ) lower than 0.01 as measured at a frequency of 1 GHz. When the dielectric loss tangent is lower than 0.01, FPC-related products excellent in electrical properties can be produced. Since the dielectric constant and the dielectric loss tangent can be adjusted according to the ratio of the modified polyolefin-based resin (A) and the epoxy resin (B) in the adhesive composition, various types of the adhesive compositions can be designed depending on the usage. The methods for measuring the dielectric constant and the dielectric loss tangent will be described later.

In addition to the modified polyolefin-based resin (A) and the epoxy resin (B), the above adhesive composition may contain, for instance, a thermoplastic resin other than the modified polyolefin-based resin (A), a tackifier, a flame retardant, a curing agent, a curing accelerator, a coupling agent, an anti-thermal aging agent, a leveling agent, an antifoaming agent, an inorganic filler, a pigment, and a solvent in amounts not affecting the function of the adhesive composition.

Examples of the above other thermoplastic resins include phenoxy resins, polyamide resins, polyester resins, polycarbonate resins, polyphenylene oxide resins, polyurethane resins, polyacetal resins, polyethylene resins, polypropylene resins, and polyvinyl resins. These thermoplastic resins may be used either alone or in combination of two or more.

Examples of the above tackifiers include coumarone-indene resins, terpene resins, terpene-phenol resins, rosin resins, p-t-butylphenol-acetylene resins, phenol-formaldehyde resins, xylene-formaldehyde resins, petroleum-based hydrocarbon resins, hydrogenated hydrocarbon resins, and turpentine-based resins. These tackifiers may be used alone or in combination of two or more.

The flame retardant may be either an organic flame retardant or an inorganic flame retardant. Examples of organic flame retardants include phosphorus based flame retardants such as melamine phosphate, melamine polyphosphate, guanidine phosphate, guanidine polyphosphate, ammonium phosphate, ammonium polyphosphate, ammonium phosphate amide, ammonium polyphosphate amide, carbamoyl phosphate, carbamoyl polyphosphate, aluminum trisdiethylphosphinate, aluminum trismethylethylphosphinate, aluminum trisdiphenylphosphinate, zinc bisdiethylphosphinate, zinc bismethylethylphosphinate, zinc bisdiphenylphosphinate, titanyl bisdiethylphosphinate, titanium tetrakisdiethylphosphinate, titanyl bismethylethylphosphinate, titanium tetrakismethylethylphosphinate, titanyl bisdiphenylphosphinate, and titanium tetrakisdiphenylphosphinate; nitrogen based flame retardants which includes triazine compounds such as melamine, melam, and melamine cyanurate, cyanuric acid compounds, isocyanuric acid compounds, triazole compounds, tetrazole compounds, diazo compounds, and urea; and silicon based flame retardants such as silicone compounds and silane compounds. Examples of the inorganic flame retardants include metal hydroxides such as aluminum hydroxide, magnesium hydroxide, zirconium hydroxide, barium hydroxide, and calcium hydroxide; metal oxides such as tin oxide, aluminum oxide, magnesium oxide, zirconium oxide, zinc oxide, molybdenum oxide, and nickel oxide; zinc carbonate, magnesium carbonate, barium carbonate, zinc borate, and hydrated glass. These flame retardants may be used in combination of two or more.

Examples of the above curing agents include, but not limited thereto, amine-based curing agents and acid anhydride-based curing agents. Amine-based curing agents include, for instance, melamine resins such as methylated melamine resin, butylated melamine resin, and benzoguanamine resin; dicyandiamide, and 4,4'-diphenyldiaminosulfone. Acid anhydrides include, for example, aromatic acid anhydrides and aliphatic acid anhydrides. These curing agents may be used alone or in combination of two or more.

The content of the curing agent is preferably from 1 to 100 parts by mass, more preferably from 5 to 70 parts by mass, relative to 100 parts by mass of the epoxy resin (B).

The above curing accelerator is used for the purpose of accelerating the reaction of the modified polyolefin-based resin and the epoxy resin. Usable as the curing accelerator are tertiary amine-based curing accelerator, tertiary amine salt based curing accelerator, and imidazole based curing accelerator.

Examples of the tertiary amine-based curing accelerator include benzyldimethylamine, 2-(dimethylaminomethyl) phenol, 2,4,6-tris(dimethylaminomethyl)phenol, tetramethylguanidine, triethanolamine, N,N'-dimethylpiperadine, triethylenediamine, and 1,8-diazabicyclo[5.4.0] undecene.

Examples of the tertiary amine salt based curing accelerator include a formic acid salt, an octylic acid salt, a p-toluenesulfonic acid salt, an o-phthalic acid salt, a phenol salt or a phenol novolac resin salt of 1,8-diazabicyclo[5.4.0] undecene, as well as a formic acid salt, an octylic acid salt, a p-toluenesulfonic acid salt, an o-phthalic acid salt, a phenol salt or a phenol novolac resin salt of 1,5-diazabicyclo [4.3.0] nonene.

Examples of the imidazole based curing accelerator include 2-methylimidazole, 2-undecylimidazole, 2-heptadecylimidazole, 1,2-dimethylimidazole, 2-methyl-4-ethylimidazole, 2-phenylimidazole, 2-phenyl-4-methylimidazole, 1-benzyl-2-methylimidazole, 1-benzyl-2-phenylimidazole, 2,4-diamino-6-[2'-methylimidazolyl-(1')]ethyl-s-triazine, 2,4-diamino-6-[2'-undecylimidazolyl-(1')]ethyl-s-triazine, 2,4-diamino-6-[2'-ethyl-4'-methylimidazolyl-(1')]ethyl-s-triazine, 2,4-diamino-6-[2'-methylimidazolyl-(1')]ethyl-s-triazine isocyanurate adduct, 2-phenylimidazole isocyanurate adduct, 2-phenyl-4,5-dihydroxymethylimidazole, and 2-phenyl-4-methyl-5-hydroxymethylimidazole. These curing accelerators may be used alone or in combination of two or more.

When the curing accelerator is contained in the adhesive composition, the content of the curing accelerator is preferably 1 to 10 parts by mass, more preferably 2 to 5 parts by mass, relative to 100 parts by mass of the epoxy resin (B). Excellent adhesiveness and thermal resistance can be exhibited so long as the content of the curing accelerator is in the aforementioned range.

Examples of the coupling agents include silane-based coupling agents such as vinyltrimethoxysilane, 3-glycydoxypropyltrimethoxysilane, p-styryltrimethoxysilane, 3-methacryloxypropylmethyldimethoxysilane, 3-acryloxypropyltrimethoxysilane, N-2-(aminoethyl)-3-aminopropylmethyldimethoxysilane, 3-ureidopropyltriethoxysilane, 3-mercaptopropylmethyldimethoxysilane, bis(triethoxysilylpropyl)tetrasulfide, 3-isocyanatopropyltriethoxysilane, and imidazolesilane; titanate-based coupling agents, aluminate-based coupling agents, and zirconium-based coupling agents. These may be used alone or in combination of two or more.

Examples of the anti-thermal aging agents include phenol-based antioxidants such as 2,6-di-tert-butyl-4-methylphenol, n-octadecyl-3-(3',5'-di-tert-butyl-4'-hydroxyphenyl) propionate, tetrakis[methylene-3-(3,5-di-tert-butyl-4-hydroxyphenyl)propionate]methane, pentaerythritol tetrakis [3-(3,5-di-tert-butyl-4-hydroxyphenol, and triethylene glycol bis[3-(3-tert-butyl-4-hydroxy-5-methylphenyl)propionate; sulfur-based antioxidants such as dilauryl 3,3'-thiodipropionate, and dimyristyl 3,3'-dithiopropionate; and phosphorus-based antioxidants such as tris(nonylphenyl) phosphite, and tris(2,4-di-tert-butylphenyl) phosphite. These may be used alone or in combination of two or more.

Examples of the inorganic fillers include powders of titanium oxide, aluminum oxide, zinc oxide, carbon black, silica, talc, copper, and silver. These may be used alone or in combination of two or more.

The adhesive composition can be produced by mixing the modified polyolefin-based resin (A), the epoxy resin (B), and other components. The mixing method is not specifically limited so long as a uniform adhesive composition is obtained. Since the adhesive composition is preferably used in the form a solution or a dispersion, a solvent is generally employed. Examples of the solvents include alcohols such as methanol, ethanol, isopropyl alcohol, n-propyl alcohol, isobutyl alcohol, n-butyl alcohol, benzyl alcohol, ethylene glycol monomethyl ether, propylene glycol monomethyl ether, diethylene glycol monomethyl ether, and diacetone alcohol; ketones such as acetone, methyl ethyl ketone, methyl isobutyl ketone, methyl amyl ketone, cyclohexanone, and isophorone; aromatic hydrocarbons such as toluene, xylene, ethylbenzene, and mesitylene; esters such as methyl acetate, ethyl acetate, ethylene glycol monomethyl ether acetate, and 3-methoxybutyl acetate; and aliphatic hydrocarbons such as hexane, heptane, cyclohexane, and methylcyclohexane. These solvents may be used alone or in combination of two or more. When the adhesive composition is a solution or a dispersion (resin varnish) containing a solvent, the application to the base film and the formation of the adhesive layer can be smoothly carried out to readily obtain an adhesive layer at a desired thickness.

When the adhesive composition contains a solvent, the solid concentration is preferably from 3 to 80 mass %, and more preferably 10 to 50 mass %, from the viewpoint of, for example, workability including formation of the adhesive layer. If the solid concentration is 80 mass % or less, a solution with a favorable viscosity can be obtained to facilitate uniform coating.

2. The Laminate Having an Adhesive Layer

The laminate having an adhesive layer according to the present invention comprises an adhesive layer formed of the above adhesive composition and a base film contacting at least one of the surfaces of the adhesive layer, and is further characterized in that the adhesive layer is in B stage. Herein, the "adhesive layer is in B stage" refers to a semi-cured state in which a part of the adhesive composition starts curing, so that the curing of the adhesive composition further proceeds by heating or the like.

An embodiment of the laminate having an adhesive layer according to the present invention includes a coverlay film. A coverlay film comprises the aforementioned adhesive layer which is formed on at least one of the surfaces of a base film, and the adhesive layer cannot be easily peeled off from the base film.

When the laminate having an adhesive layer is a coverlay film, examples of the base film include a polyimide film, a polyether ether ketone film, a polyphenylene sulfide film, an aramid film, a polyethylene naphthalate film, and a liquid crystal polymer film. Preferred among them from the viewpoint of adhesiveness and electrical properties are a polyimide film, a polyethylene naphthalate film, and a liquid crystal polymer film.

The aforementioned base films are commercially available; for instance, examples of the polyimide film include "KAPTON (registered trademark)" manufactured by Du Pont Toray Co., Ltd., "XENOMAX (registered trademark)" manufactured by Toyobo Co., Ltd., "UPILEX (registered trademark)-S" manufactured by Ube Industries, Ltd., and "APICAL (registered trademark)" manufactured by Kaneka Corporation. Examples of the polyethylene naphthalate film include "TEONEX (registered trademark)" manufactured by Teijin DuPont Films Japan Limited. Furthermore, examples of the liquid crystal polymer film include "VECSTAR (registered trademark)" manufactured by Kurary Co., Ltd, and "BIAC (registered trademark)" manufactured by Primatec Co., Ltd. The base film can also be obtained by making a film of desired thickness from the corresponding resin.

The coverlay film can be produced, for example, by coating a surface of a base film such as a polyimide film with a resin varnish containing the above adhesive composition and a solvent to form a resin varnish layer, and then removing the solvent from the resin varnish layer to obtain a coverlay film having an adhesive layer in B stage.

The drying temperature to remove the solvent is preferably from 40 to 250° C., and more preferably from 70 to 170° C. The drying process is carried out by passing the laminate having the adhesive composition coated thereon through a furnace in which hot air drying, far infrared heating, high frequency induction heating or the like is carried out.

Furthermore, if necessary, a release film may be laminated onto the surface of the adhesive layer for preservation and the like. Examples of the release film include those known in the art, such as a polyethylene terephthalate film, a polyethylene film, a polypropylene film, a silicone-treated release paper, a polyolefin resin-coated paper, a polymethyl pentene (TPX) film, and a fluororesin film.

Another embodiment of the laminate having an adhesive layer includes a bonding sheet. The bonding sheet comprises the aforementioned adhesive layer formed on the surface of a base film wherein a release film is used as the base film. In another embodiment of the bonding sheet, the adhesive layer may be incorporated between two release films. The release film is peeled off when the bonding sheet is used. Examples of the release film are those mentioned above.

Such release films are commercially available, and examples thereof include "LUMIRROR (registered trademark)" manufactured by Toray Industries, Inc., "TOYOBO ESTER (registered trademark) film" manufactured by Toyobo Co., Ltd., "AFLEX (registered trademark)" manufactured by Asahi Glass Co., Ltd., and "OPULENT (registered trademark)" manufactured by Mitsui Chemicals Tohcello. Inc.

The bonding sheet can be produced by, for instance, coating the surface of a release film with a resin varnish containing the adhesive composition and a solvent, followed by drying in the same manner as in the case of the aforementioned coverlay film.

In order to make thinner the laminate having the adhesive layer, the thickness of the base film is preferably from 5 to 100 μm, more preferably from 5 to 50 μm, and still more preferably from 5 to 30 μm.

The thickness of the adhesive layer in B stage is preferably from 5 to 100 μm, more preferably from 10 to 70 μm, and still more preferably 10 to 50 μm.

Although the thicknesses of the above base film and adhesive layer are selected depending on usage, the base film tend to be thinner to improve electrical properties. In general, warpage of the laminate having an adhesive layer tends to occur and impairs workability with decreasing the thickness of the base film and increasing the thickness of the adhesive layer. However, the laminate having an adhesive layer according to the present invention hardly causes the warpage of the laminate even when the base film is thin and the adhesive layer is thick. In the laminate having an adhesive layer according to the present invention, the ratio of the thickness of the adhesive layer (A) to the thickness of the base film (B), i.e., (A/B), is preferably not less than 1 and not more than 10, and more preferably not less than 1 and not more than 5. Further, it is preferred that the thickness of the adhesive layer is larger than the thickness of the base film.

It is preferred that the warpage of the laminate having an adhesive layer is as small as possible because the warpage affects workability in the production process of FPC-related products. More specifically, when a square-shaped laminate having an adhesive layer is placed on a horizontal surface with the adhesive layer facing up, the ratio (H/L) wherein H is an elevation of an edge of the laminate and L is a side length of the laminate is preferably less than 0.05. The ratio is more preferably less than 0.04, and still more preferably less than 0.03. When the ratio (H/L) is less than 0.05, a laminate with excellent workability can be obtained because the warpage or curling of the laminate can be suppressed.

Additionally, the lower limit of the H/L is 0, i.e., when H is 0.

The laminate having the adhesive layer preferably yields a dielectric constant (ε) lower than 3.0 and a dielectric loss tangent (tan δ) lower than 0.01 when measured at a frequency of 1 GHz after the adhesive layer of the laminate is cured. More preferably, the dielectric constant is 2.9 or lower, and the dielectric loss tangent is 0.005 or lower. The laminate can be favorably used in FPC-related products which must meet strict electrical property requirements so long as the laminate yields a dielectric constant lower than 3.0 and a dielectric loss tangent lower than 0.01. Since the dielectric constant and the dielectric loss tangent can be adjusted by the type and content of the adhesive component or the type of the base film and the like, various types of laminates can be designed depending on the usage.

Furthermore, it is preferred that the laminate having the adhesive layer yields a dielectric constant (ε) of 2.2 or more and a dielectric loss tangent (tan δ) of 0 or more as measured at a frequency of 1 GHz after the adhesive layer of the laminate is cured.

3. Flexible Copper Clad Laminate

The flexible copper clad laminate according to the present invention is characterized in that a base film and a copper foil are bonded to each other using the aforementioned laminate having an adhesive layer. That is, the flexible copper clad laminate according to the present invention comprises a base film, an adhesive layer, and a copper foil in this order. The adhesive layer and the copper foil may be formed on both surfaces of the base film. Since the adhesive composition of the present invention is excellent in adhesion to articles containing copper, the flexible copper clad laminate according to the present invention is provided as an integrated product excellent in stability.

The method for producing the flexible copper clad laminate according to the present invention includes, for instance, a method in which the surface of the adhesive layer of the laminate is brought in contact with the copper foil, hot lamination is carried out at from 80 to 150° C., and then the adhesive layer is cured by after-curing. The after-curing conditions can be, for example, at from 100 to 200° C. for from 30 minutes to 4 hours. There is no particular limitation on the copper foil, and usable are electrolytic copper foil, rolled copper foil, and the like.

4. Flexible Flat Cable (FFC)

The flexible flat cable according to the present invention is characterized in that a base film and a copper wiring are bonded to each other using the aforementioned laminate having an adhesive layer. That is, the flexible flat cable according to the present invention comprises a base film, an adhesive layer, and a copper wiring in this order. The adhesive layer and the copper wiring may be formed on both surfaces of the base film. Since the adhesive composition of the present invention is excellent in adhesion to articles containing copper, the flexible flat cable according to the present invention is provided as an integrated product excellent in stability.

The method for producing the flexible flat cable according to the present invention includes, for instance, a method in which the adhesive layer of the laminate is brought in contact with the copper wiring, hot lamination is carried out at from 80 to 150° C., and then the adhesive layer is cured by after-curing. The after-curing condition can be, for example, at from 100 to 200° C. for from 30 minutes to 4 hours. There is no particular limitation on the shape of the copper wiring, so the shape and the like can be properly selected as desired.

EXAMPLES

The present invention is explained in further detail by way of Examples below, but the present invention is not limited thereto. In the explanation below, parts and % are on mass basis unless otherwise stated.

1. Evaluation Method (1) Weight Average Molecular Weight (Mw)

GPC measurement was carried out under the following conditions to determine Mw of the modified polyolefin-based resin. Mw was determined by converting the retention time measured by GPC based on standard polystyrene retention time.

Instrument: Alliance2695 (manufactured by Waters)
Column: 2 columns of TSK gel SuperMultiporeHZ-H
2 columns of TSK gel SuperHZ2500
(manufactured by Tosoh Corporation)
Column temperature: 40° C.
Carrier solvent: Tetrahydrofuran 0.35 ml/min
Detector: RI (Differential Refractive Index Detector)

(2) Acid Value

One (1) gram of the modified polyolefin-based resin was dissolved in 30 ml of toluene, and an automatic titrator "AT-510" (manufactured by KYOTO ELECTRONICS MANUFACTURING CO., LTD.) to which a burette "APB-510-20B" (manufactured by the same) was connected was used. Potentiometric titration was carried out using 0.01 mol/L benzyl alcoholic KOH solution as a titrant, and an amount in milligrams of KOH per 1 g of resin was calculated.

(3) Warpage

A 25-μm thick polyimide film (200 mm length×200 mm width) was prepared, and the liquid adhesive compositions listed in Table 1 were each applied by roll-coating to one of the surfaces of the film. The coated film was then allowed to stand still in an oven, and was dried at 90° C. for 3 minutes to form a 25-μm thick adhesive layer in B stage to obtain a coverlay film A1 (a 50-μm thick laminate having the adhesive layer). The resulting coverlay film A1 was placed on a horizontal plane with the adhesive layer facing upward, and the elevation in the vertical direction was measured at each of the four corners. The thus-measured elevations at the four corners were averaged, and the ratio of the average elevation (H) to the side length (L) of the laminate, i.e., H/L, was obtained and used to evaluate the warpage.

Further, a coverlay film B1 (a 50-μm thick laminate having the adhesive layer) was prepared in the same manner as above, except for changing the thickness of the polyimide film to 12.5 μm and the thickness of the adhesive layer to 37.5 μm, and was subjected to evaluation.

<Evaluation Criteria>
 ⊚: H/L is lower than 0.020
 ○: H/L is 0.030 or more and lower than 0.05
 ×: H/L is 0.10 or more (4) Peel Adhesion Strength A 25-μm thick polyimide film was prepared, and the liquid adhesive compositions listed in Table 1 were each applied by roll-coating to one of the surfaces of the film. The coated film was then allowed to stand still in an oven, and was dried at 90° C. for 3 minutes to form a 25-μm thick adhesive layer in B stage to obtain a coverlay film (a laminate having the adhesive layer). Then, a 35-μm thick rolled copper foil was brought into surface contact with the surface of the adhesive layer of the coverlay film, and the resultant was subjected to lamination under a temperature of 120° C., a pressure of 0.4 MPa, and a speed of 0.5 m/minute. Then, the resulting laminate (polyimide film/adhesive layer/copper foil) was subjected to hot pressing at a temperature of 180° C. and a pressure of 3 MPa for 30 minutes to obtain a flexible copper clad laminate A. The thus-obtained flexible copper clad laminate A was cut into a specified size to prepare an adhesion test piece.

Further, a flexible copper clad laminate B was prepared in the same manner as above, except for changing the thickness of the polyimide film to 12.5 μm and the thickness of the adhesive layer to 37.5 μm, to prepare an adhesion test piece.

In accordance with JIS C 6481 "Test methods of copper-clad laminates for printed wiring boards", adhesiveness was evaluated by measuring a 180° peel adhesion strength (N/mm) when the copper foil of each adhesion test piece was peeled off from the polyimide film under a temperature of 23° C. and a tensile speed of 50 mm/minute. The width of the adhesion test piece at the time of measurement was 10 mm.

(5) Solder Heat Resistance

The test was conducted in accordance with JIS 6481 "Test methods of copper-clad laminates for printed wiring boards". The adhesion test pieces were each cut into 25-mm square, and were subjected to heat treatment at 120° C. for 30 minutes. Then, with the polyimide film facing up, the adhesion test pieces were floated on a solder bath for 10 seconds at a predetermined temperature to observe foaming on the surface of the adhesion test pieces. The maximum temperature at which no foaming was observed on the adhesion test piece was taken as the temperature of solder heat resistance.

(6) Resin Flow

A 25-μm thick polyimide film was prepared, and the liquid adhesive compositions listed in Table 1 were each applied by roll-coating to one of the surfaces of the film. The coated film was then allowed to stand still in an oven, and was dried at 90° C. for 3 minutes to form a 25-μm thick adhesive layer in B stage to obtain a coverlay film (a laminate having the adhesive layer). Then, after punching a hole of 6-mm in diameter from the surface of the adhesive layer in the coverlay film, a 35-μm thick rolled copper foil was layered thereon, and the resultant was subjected to lamination under a temperature of 120° C., a pressure of 0.4 MPa, and a speed of 0.5 m/minute. The resulting laminate A (polyimide film/adhesive layer/copper foil) was subjected to hot pressing at a temperature of 180° C. and a pressure of 3 MPa for 30 minutes. This caused the resin to flow from the edge of the hole of the polyimide film of the integrated laminate, and the maximum length protruding from the edge of the hole was measured. It was determined that the shorter the maximum protruding length was, the better the resin flow was, and the greater the maximum protruding length was, the worse the resin flow was. This resin flow reflects embeddability into the wiring portions of the FPC-related products.

Further, a laminate B was prepared and evaluated in the same manner as above, except for changing the thickness of the polyimide film to 12.5 μm and the thickness of the adhesive layer to 37.5 μm.

(7) Electrical Properties (Dielectric Constant and Dielectric Loss Tangent)

(a) Cured Body of Adhesive

A 38-μm thick polyethyleneterephthalate release film was prepared, and one of the surfaces thereof was roll-coated with a liquid adhesive composition listed in Table 1. The coated film was then allowed to stand still in an oven, and was dried at 90° C. for 3 minutes to form a 50-μm thick film (adhesive layer) to obtain a bonding sheet. This bonding sheet was then allowed to stand still in an oven, and was treated with heat at 180° C. for 30 minutes. Subsequently, the release film was removed to prepare a test piece of 15 mm×80 mm in size.

The dielectric constant (ε) and the dielectric loss tangent (tan δ) were measured using a network analyzer 85071E-300 (manufactured by Agilent Technologies, Inc.) in accordance with the split post dielectric resonator (SPDR) method, at a temperature of 23° C. and at a frequency of 1 GHz.

(b) Laminate Having Adhesive Layer

A 25-μm thick polyimide film was prepared, and one of the surfaces thereof was roll-coated with a liquid adhesive composition listed in Table 1. The coated film was then allowed to stand still in an oven, and was dried at 90° C. for 3 minutes to form a 25-μm thick adhesive layer in B stage to obtain a coverlay film A2 (a 50-μm thick laminate having the adhesive layer). The resulting coverlay film A2 was then allowed to stand still in an oven, and was heated and cured at 180° C. for 30 minutes to obtain a test piece of 120 mm×100 mm in size.

Further, a coverlay film B2 (a 50-μm thick laminate having the adhesive layer) was prepared in the same manner as above, except for changing the thickness of the polyimide film to 12.5 μm and the thickness of the adhesive layer to 37.5 μm. The resultant was subjected to heat curing treatment at 180° C. for 30 minutes to obtain a test piece of 120 mm×100 mm in size.

The dielectric constant (ε) and the dielectric loss tangent (tan δ) of the laminate having an adhesive layer were measured using a network analyzer 85071E-300 (manufactured by Agilent Technologies, Inc.) in accordance with the split post dielectric resonator (SPDR) method, at a temperature of 23° C. and at a frequency of 1 GHz.

(8) Storage Stability of the Laminate Having an Adhesive Layer

A coverlay film A2 (a 50-μm thick laminate having the adhesive layer) prepared in the same manner as in the aforementioned (7)(b) was stored at 23° C. for a predetermined duration of time, and the coverlay film A2 after storage was subjected to hot pressing with a copper single-sided board (L/S=50 μm/50 μm, having copper thickness of 18 μm) at a temperature of 180° C. and a pressure of 3 MPa for 3 minutes to evaluate a filling property of the resin. The storage period of time at which the resin no longer fills in the substrate was taken for evaluation.

<Evaluation Criteria>
- ○: 2 months or longer
- Δ: 1 week or longer and less than 1 month 2. Preparation of Modified Polyolefin-Based Resins (1) Modified Polyolefin-based Resin a1

One hundred (100) parts by mass of a propylene-ethylene random copolymer composed of 97 mol % of propylene units and 3 mol % of ethylene units produced using a metallocene catalyst as a polymerization catalyst, 0.5 part by mass of maleic anhydride, 0.3 part by mass of lauryl methacrylate and 0.4 part by mass of di-t-butylperoxide were kneaded and reacted in a twin-screw extruder in which the maximum temperature at the cylinder portion thereof was set to 170° C. Then, the remaining unreacted substances were removed by degassing in vacuo in the extruder to produce a modified polyolefin-based resin a1. The modified polyolefin-based resin a1 had a weight average molecular weight of 180,000, and an acid value of 4 mg KOH/g.

(2) Modified Polyolefin-based Resin a2

One hundred (100) parts by mass of a propylene-ethylene random copolymer composed of 97 mol % of propylene units and 3 mol % of ethylene units produced using a metallocene catalyst as a polymerization catalyst, 1.0 part by mass of maleic anhydride, 0.5 part by mass of lauryl methacrylate and 0.8 part by mass of di-t-butylperoxide were kneaded and reacted in a twin-screw extruder in which the maximum temperature at the cylinder portion thereof was set to 170° C. Then, the remaining unreacted substances were removed by degassing in vacuo in the extruder to produce a modified polyolefin-based resin a2. The modified polyolefin-based resin a2 had a weight average molecular weight of 150,000, and an acid value of 10 mg KOH/g.

(3) Modified Polyolefin-based Resin a3

One hundred (100) parts by mass of a propylene-ethylene random copolymer composed of 97 mol % of propylene units and 3 mol % of ethylene units produced using a metallocene catalyst as a polymerization catalyst, 1.5 part by mass of maleic anhydride, 0.8 part by mass of lauryl methacrylate and 1.2 part by mass of di-t-butylperoxide were kneaded and reacted in a twin-screw extruder in which the maximum temperature at the cylinder portion thereof was set to 170° C. Then, the remaining unreacted substances were removed by degassing in vacuo in the extruder to produce a modified polyolefin-based resin a3. The modified polyolefin-based resin a3 had a weight average molecular weight of 130,000, and an acid value of 15 mg KOH/g.

(4) Modified Polyolefin-based Resin a4

One hundred (100) parts by mass of a propylene/1-butene copolymer (mass ratio: propylene/1-butene=70/30) was heated and molten in a four neck flask under nitrogen atmosphere. Then, while the system was maintained at an inner temperature of 170° C. under stirring, 3.0 parts by mass of maleic anhydride as an unsaturated carboxylic acid and 2.5 parts by mass of dicumylperoxide as a radical initiator were each added thereto for one hour, and then allowed to react for one hour. After the completion of the reaction, the obtained reaction product was placed in a large amount of acetone to solidify the resin. This resin was cut into pieces and processed into pellets. Next, this pelletized resin was mixed with acetone in an amount of three-times the mass of the resin, and stirred for one hour at a temperature being maintained to be 50° C. to wash the resin. The resin was collected, and then was further washed in the same method as above to remove the free maleic anhydride. The washed resin was dried under reduced pressure in a depressurized dryer to obtain a modified polyolefin-based resin a4. The modified polyolefin-based resin a4 had a weight average molecular weight of 100,000, and an acid value of 30 mg KOH/g.

(5) Modified Polyolefin-based Resin a5

One hundred (100) parts by mass of a propylene/1-butene copolymer (mass ratio: propylene/1-butene=70/30) was heated and molten in a four neck flask under nitrogen atmosphere. Then, while the system was maintained at an inner temperature of 170° C. under stirring, 1.5 part by mass of maleic anhydride as an unsaturated carboxylic acid and 1.2 part by mass of dicumylperoxide as a radical initiator were each added thereto for one hour, and then allowed to react for one hour. After the completion of the reaction, the obtained reaction product was placed in a large amount of acetone to solidify the resin. This resin was cut into pieces and processed into pellets. Next, this pelletized resin was mixed with acetone in an amount of three-times the mass of the resin, and stirred for one hour at a temperature being maintained to be 50° C. to wash the resin. The resin was collected, and then was further washed in the same method as above to remove the free maleic anhydride. The washed resin was dried under reduced pressure in a depressurized dryer to obtain a modified polyolefin-based resin a5. The modified polyolefin-based resin a5 had a weight average molecular weight of 150,000, and an acid value of 15 mg KOH/g.

(6) Modified Polyolefin-based Resin a6

One hundred (100) parts by mass of a propylene/1-butene copolymer (mass ratio: propylene/1-butene=70/30) was heated and molten in a four neck flask under nitrogen atmosphere. Then, while the system was maintained at an inner temperature of 170° C. under stirring, 6.0 parts by mass of maleic anhydride as an unsaturated carboxylic acid and 5.0 parts by mass of dicumylperoxide as a radical initiator were each added thereto for one hour, and then allowed to react for one hour. After the completion of the reaction, the obtained reaction product was placed in a large amount of acetone to solidify the resin. This resin was cut into pieces and processed into pellets. Next, this pelletized resin was mixed with acetone in an amount of three-times the mass of the resin, and stirred for one hour at a temperature being maintained to be 50° C. to wash the resin. The resin was collected, and then was further washed in the same method as above to remove the free maleic anhydride. The washed resin was dried under reduced pressure in a depressurized dryer to obtain a modified polyolefin-based resin a6. The modified polyolefin-based resin a6 had a weight average molecular weight of 130,000, and an acid value of 60 mg KOH/g.

3. Raw Materials of the Adhesive Composition
3-1. Styrene Based Resin
·Styrene-Containing Oligomer
"OPE-St resin" (trade name) manufactured by Mitsubishi Gas Chemical Company, Inc., was used.
3-2. Epoxy Resin
(1) Epoxy Resin b1
An epoxy resin having a dicyclopentadiene structure, "EPICLON HP-7200" (trade name) manufactured by DIC Corporation, was used.
(2) Epoxy Resin b2
A cresol novolac epoxy resin, "EPICLON N-655 EXP" (trade name), manufactured by DIC Corporation, was used.
(3) Epoxy Resin b3
A glycidylamino based epoxy resin, "TETRAD-C" (trade name), manufactured by Mitsubishi Gas Chemical Company, Inc., was used.
3-3. Others
(1) Curing Accelerator
An imidazole-based curing accelerator "CURESOL C11-Z" (trade name), manufactured by Shikoku Chemicals Corporation was used.

(2) Inorganic Filler
Silica, "EXCELICA SE-1" (trade name), manufactured by Tokuyama Corporation was used.
(3) Solvent
A mixed solvent constituted by toluene and methyl ethyl ketone at a mass ratio of 90:10 was used.
4. Preparation and Evaluation of the Adhesive Composition
The above raw materials were put into a flask equipped with a stirrer in the proportion shown in Table 1, and were dissolved under stirring for 6 hours at room temperature (25° C.) to obtain a liquid adhesive composition containing 20% of solid content. The results are given in Table 2.
5. Preparation and Evaluation of the Laminate Having an Adhesive Layer

EXAMPLES 1 TO 10 AND COMPARATIVE EXAMPLES 1 TO 3

Laminates having an adhesive layer were each prepared using the above adhesive compositions, and were subjected to evaluation. The results are given in Table 2.

TABLE 1

| | | Examples | | | | | | | | | | Comparative Examples | | |
|---|---|---|---|---|---|---|---|---|---|---|---|---|---|---|
| | | 1 | 2 | 3 | 4 | 5 | 6 | 7 | 8 | 9 | 10 | 1 | 2 | 3 |
| Composition (parts by mass) | Modified polyolefin-based resin a1 | 100 | | | | | 100 | 100 | 100 | 100 | 80 | 50 | | 100 |
| | Modified polyolefin-based resin a2 | | 100 | | | | | | | | | | | |
| | Modified polyolefin-based resin a3 | | | 100 | | | | | | | | | | |
| | Modified polyolefin-based resin a4 | | | | 100 | | | | | | | | | |
| | Modified polyolefin-based resin a5 | | | | | 100 | | | | | | | | |
| | Modified polyolefin-based resin a6 | | | | | | | | | | | | 100 | |
| | Styrene-containing oligomer | | | | | | | | | | 20 | 50 | | |
| | Epoxy resin b1 | 3 | 6 | 10 | 15 | 7 | 9 | | | 3 | 3 | 6 | 23 | 25 |
| | Epoxy resin b2 | | | | | | | 3 | | | | | | |
| | Epoxy resin b3 | | | | | | | | 3 | | | | | |
| | Curing accelerator | 0.2 | 0.2 | 0.3 | 0.4 | 0.2 | 0.2 | 0.2 | 0.2 | 0.2 | 0.2 | 0.2 | 1 | 1 |
| | Inorganic filler | | | | | | | | | 15 | | | | |
| | Solvent | 400 | 400 | 400 | 400 | 400 | 400 | 400 | 400 | 400 | 400 | 450 | 450 | 450 |

TABLE 2

| | | Examples | | | | | | | | | | Comparative Examples | | |
|---|---|---|---|---|---|---|---|---|---|---|---|---|---|---|
| | | 1 | 2 | 3 | 4 | 5 | 6 | 7 | 8 | 9 | 10 | 1 | 2 | 3 |
| Results of Evaluation | Dielectric constant (ε) of cured body of adhesive | 2.2 | 2.2 | 2.3 | 2.2 | 2.3 | 2.3 | 2.3 | 2.3 | 2.4 | 2.4 | 2.4 | 2.5 | 2.5 |
| | Dielectric loss tangent (tan δ) of cured body of adhesive | 0.002 | 0.002 | 0.003 | 0.003 | 0.003 | 0.003 | 0.005 | 0.003 | 0.002 | 0.005 | 0.005 | 0.007 | 0.006 |
| | Warpage of coverlay film A1 | ◎ | ◎ | ◎ | ◎ | ◎ | ◎ | ◎ | ◎ | ◎ | ○ | X | ◎ | ○ |

TABLE 2-continued

|  | Examples | | | | | | | | | | Comparative Examples | | |
| --- | --- | --- | --- | --- | --- | --- | --- | --- | --- | --- | --- | --- | --- |
|  | 1 | 2 | 3 | 4 | 5 | 6 | 7 | 8 | 9 | 10 | 1 | 2 | 3 |
| Peel adhesion strength of flexible copper clad laminate A (N/mm) | 1.7 | 1.6 | 1.5 | 1.4 | 1.0 | 1.5 | 1.7 | 1.7 | 1.8 | 1.5 | 1.7 | 0.9 | 0.4 |
| Solder heat resistance of flexible copper clad laminate A (° C.) | 360 | 300 | 280 | 360 | 320 | 360 | 360 | 360 | 360 | 360 | 360 | 300 | 360 |
| Resin flow of laminate A (mm) | 0.25 | 0.20 | 0.20 | 0.20 | 0.10 | 0.15 | 0.25 | 0.25 | 0.10 | 0.10 | 0.10 | 0.45 | 0.2 |
| Dielectric constant (ε) of coverlay film A2 | 2.8 | 2.8 | 2.8 | 2.9 | 2.9 | 2.9 | 2.9 | 2.8 | 2.9 | 2.9 | 2.9 | 3.0 | 3.0 |
| Dielectric loss tangent (tan δ) of coverlay film A2 | 0.004 | 0.004 | 0.005 | 0.004 | 0.005 | 0.004 | 0.005 | 0.004 | 0.004 | 0.005 | 0.005 | 0.007 | 0.006 |
| Storage stability of coverlay film A2 | ○ | ○ | ○ | ○ | ○ | ○ | ○ | Δ | ○ | ○ | ○ | ○ | ○ |
| Warpage of coverlay film B1 | ◎ | ◎ | ◎ | ◎ | ◎ | ◎ | ◎ | ◎ | ○ | ○ | X | ◎ | ○ |
| Peel adhesion strength of flexible copper clad laminate B (N/mm) | 1.9 | 1.8 | 1.6 | 1.5 | 1.2 | 1.6 | 1.7 | 1.8 | 1.9 | 1.6 | 1.8 | 1.0 | 0.5 |
| Solder heat resistance of flexible copper clad laminate B (° C.) | 360 | 300 | 280 | 360 | 320 | 360 | 360 | 360 | 360 | 360 | 360 | 300 | 360 |
| Resin flow of laminate B (mm) | 0.30 | 0.25 | 0.25 | 0.25 | 0.15 | 0.20 | 0.30 | 0.30 | 0.15 | 0.15 | 0.15 | 0.6 | 0.25 |
| Dielectric constant (ε) of coverlay film B2 | 2.6 | 2.6 | 2.6 | 2.7 | 2.7 | 2.7 | 2.7 | 2.6 | 2.7 | 2.7 | 2.8 | 2.9 | 2.9 |
| Dielectric loss tangent (tan δ) of coverlay film B2 | 0.003 | 0.003 | 0.005 | 0.004 | 0.004 | 0.004 | 0.005 | 0.004 | 0.003 | 0.005 | 0.005 | 0.007 | 0.006 |

From the results in the above Table 2, it can be understood that the adhesive compositions of Examples 1 to 10 show excellent adhesiveness, resin flow, and electrical properties. In addition, the laminates having an adhesive layer using these adhesive compositions exhibit little warpage, and therefore are satisfactory in workability in manufacturing processes of FPC-related products. On the other hand, as in Comparative Example 1, when the adhesive composition does not contain the predetermined amount of the modified polyolefin-based resin, it is deteriorated in electrical properties and causes warpage of the laminate. Furthermore, Comparative Examples 2 and 3 in which the content of the epoxy resin was outside the range specified in the present invention were deficient in adhesiveness and electrical properties.

INDUSTRIAL APPLICABILITY

The adhesive composition according to the present invention shows excellent adhesiveness, resin flow, and electrical properties. The laminate having an adhesive layer using this adhesive composition exhibits little warpage even when the base film is thin; therefore the laminate is excellent in workability. Thus, the adhesive composition and the laminate with adhesive layer using the same according to the present invention are suitable for producing FPC-related products.

The invention claimed is:

1. An adhesive composition, which comprises a modified polyolefin-based resin (A), an epoxy resin (B), and a curing accelerator, wherein
the modified polyolefin-based resin (A) is a resin resulting from graft-modification of an unmodified polyolefin resin with a modifying agent comprising an α,β-unsaturated carboxylic acid or derivative thereof,
the content of the modified polyolefin-based resin (A) is 50 parts by mass or more relative to 100 parts by mass of the solid content of the adhesive composition,
the modified polyolefin-based resin (A) has a weight average molecular weight of from 30,000 to 250,000,
the modified polyolefin-based resin (A) has an acid value of from 0.1 to 50 mg KOH/ g,
the epoxy resin (B) is an epoxy resin having no glycidylamino group,
the content of the epoxy resin (B) is 1 to 20 parts by mass relative to 100 parts by mass of the modified polyolefin-based resin,
the curing accelerator is at least one selected from the group consisting of a tertiary amine-based curing accelerator, a tertiary amine salt based curing accelerator, and an imidazole based curing accelerator, and
the adhesive composition exhibits a dielectric constant lower than 2.5 as measured at a frequency of 1 GHz when made into a cured body.

2. The adhesive composition according to claim 1, wherein the unmodified polyolefin resin is at least one selected from the group consisting of ethylene-propylene copolymers, propylene-butene copolymers and ethylene-propylene-butene copolymers.

3. The adhesive composition according to claim 1, wherein the derivative of the α,β-unsaturated carboxylic acid is at least one selected from the group consisting of itaconic anhydride, maleic anhydride, aconitic anhydride and citraconic anhydride.

4. The adhesive composition according to claim 1, wherein the content percentage of the grafted portions derived from the α,β-unsaturated carboxylic acid or derivative thereof is from 0.1 to 20 mass% relative to 100 mass % of the modified polyolefin-based resin.

5. The adhesive composition according to claim 1, wherein the epoxy resin (B) is a multifunctional epoxy resin having an alicyclic structure.

6. A laminate having an adhesive layer, which comprises an adhesive layer formed of an adhesive composition according to claim 1; and a base film contacting at least one of the surfaces of the adhesive layer, wherein the adhesive layer is in B stage.

7. The laminate having an adhesive layer according to claim 6, wherein the adhesive layer is formed by coating a resin varnish comprising the aforementioned adhesive composition and a solvent on a surface of the base film to form a resin varnish layer, and then removing the solvent from the resin varnish layer.

8. The laminate having an adhesive layer according to claim 6, which has a ratio (H/L) of less than 0.05 wherein H is an elevation of an edge of the laminate and L is a side length of the laminate when the laminate having an adhesive layer is square-shaped and placed on a horizontal surface with the adhesive layer facing up.

9. The laminate having an adhesive layer according to claim 6, wherein the base film is at least one selected from the group consisting of a polyimide film, a polyether ether ketone film, a polyphenylene sulfide film, an aramid film, a polyethylene naphthalate film, a liquid crystal polymer film, a polyethylene terephthalate film, a polyethylene film, a polypropylene film, a silicone-treated release paper, a polyolefin resin-coated paper, a polymethylpentene film, and a fluororesin film.

10. The laminate having an adhesive layer according to claim 6, wherein the thickness of the base film is from 5 to 100 μm.

11. The laminate having an adhesive layer according to claim 6, wherein the thickness of the adhesive layer is from 5 to 100 μm.

12. The laminate having an adhesive layer according to claim 6, wherein the thickness of the adhesive layer is equal to or thicker than the thickness of the base film.

13. The laminate having an adhesive layer according to claim 6, wherein, after curing the adhesive layer, the laminate exhibits a dielectric constant lower than 3.0 and a dielectric loss tangent lower than 0.01, as measured at a frequency of 1 GHz.

14. A flexible copper clad laminate which comprises a laminate having an adhesive layer according to claim 6 and a copper foil bonded onto the adhesive layer of the laminate.

15. A flexible flat cable which comprises a laminate having an adhesive layer according to claim 6 and a copper foil bonded onto the adhesive layer of the laminate.

16. The adhesive composition according to claim 1, wherein
the unmodified polyolefin resin is at least one selected from the group consisting of ethylene-propylene copolymers, propylene-butene copolymers and ethylene-propylene-butene copolymers;
the derivative of the α,β-unsaturated carboxylic acid is at least one selected from the group consisting of itaconic anhydride, maleic anhydride, aconitic anhydride and citraconic anhydride;
the content percentage of the grafted portions derived from the α,β-unsaturated carboxylic acid or derivative thereof is from 0.1 to 20 mass % relative to 100 mass % of the modified polyolefin-based resin;
the modified polyolefin-based resin (A) has a weight average molecular weight of from 50,000 to 200,000;
the modified polyolefin-based resin (A) has an acid value of from 0.5 to 40 mg KOH/g; and
the epoxy resin (B) is a multifunctional epoxy resin having an alicyclic structure.

17. The adhesive composition according to claim 1, wherein the modified polyolefin-based resin (A) has an acid value of from 0.5 to 40 mg KOH/g.

18. The adhesive composition according to claim 1, wherein the modified polyolefin-based resin (A) has an acid value of from 1.0 to 30 mg KOH/g.

19. The adhesive composition according to claim 1, wherein the modified polyolefin-based resin (A) has an acid value of from 4 to 30 mg KOH/g.

20. The adhesive composition according to claim 19, wherein the modified polyolefin-based resin (A) has an acid value of from 4 to 15 mg KOH/g.

21. The adhesive composition according to claim 1, wherein the content of the curing accelerator is 1 to 10 parts by mass relative to 100 parts by mass of the epoxy resin (B).

* * * * *